United States Patent [19]
Hiller

[11] Patent Number: 5,187,481
[45] Date of Patent: Feb. 16, 1993

[54] COMBINED AND SIMPLIFIED MULTIPLEXING AND DITHERED ANALOG TO DIGITAL CONVERTER

[75] Inventor: Donald R. Hiller, Lake Stevens, Wash.

[73] Assignee: Hewlett-Packard Company, Palo Alto, Calif.

[21] Appl. No.: 817,710

[22] Filed: Jan. 7, 1992

Related U.S. Application Data

[63] Continuation-in-part of Ser. No. 637,899, Jan. 3, 1991, and a continuation-in-part of Ser. No. 593,441, Oct. 5, 1990, Pat. No. 5,134,399.

[51] Int. Cl.$^5$ .............................................. H03M 1/20
[52] U.S. Cl. ..................................... 341/131; 341/139
[58] Field of Search ................. 311/118, 131, 139, 141

[56] References Cited

U.S. PATENT DOCUMENTS

| | | | |
|---|---|---|---|
| 4,550,309 | 10/1985 | Hiller et al. | 341/131 |
| 4,764,748 | 8/1988 | Geen et al. | 341/131 |
| 4,812,846 | 3/1989 | Nord | 341/131 |
| 4,814,767 | 3/1989 | Fernandes et al. | 341/158 |
| 4,914,439 | 4/1990 | Nakahashi et al. | 341/131 |
| 4,968,988 | 11/1990 | Miki et al. | 341/141 |

OTHER PUBLICATIONS

Pending U.S. application Ser. No. 07/442,379 of Hilton, filed Nov. 27, 1989 Now U.S. Pat. No. 4,996,530.
Honig, et al., *Adaptive Filters*, Excerpt from book, Sections 3.1 and 3.2, pp. 48-53, 1985.
Pending U.S. patent application Ser. No. 07/593,441 of Hiller, filed Oct. 5, 1990, Now U.S. Pat. No. 5,134,399.
Pending U.S. patent application Ser. No. 07/883,895 of Hiller, filed May 12, 1992.

*Primary Examiner*—Marc Hoff

[57] ABSTRACT

A circuit for analog-to-digital conversion is disclosed comprising multiplexed ADCs. Dithering is introduced into the circuit before conversion and subtracted out of the resulting digital output stream. Gain control feedback loops are employed to eliminate non-unity gain error of the dither signal and multiplexed ADC differential gain errors. Correlation between the digital output stream and the dither signal is used to detect a non-unity condition and derive gain control feedback. Correlation with the dither signal is also used to detect gain differences between multiplexed ADCs and generate corrective feedback.

25 Claims, 3 Drawing Sheets

COMBINED AND SIMPLIFIED MULTIPLEXING AND DITHERED ANALOG TO DIGITAL CONVERTER

This application is a continuation-in-part of my copending application Ser. No. 07/637,899, filed Jan. 3, 1991, and is also a continuation-in-part of my allowed application Ser. No. 07/593,441, filed Oct. 5, 1990. These disclosures are incorporated by reference.

FIELD OF THE INVENTION

The present invention relates to analog-to-digital converters in which dithering is employed to improve conversion accuracy, and more particularly the employment of dithering in multiplexed analog-to-digital converters.

BACKGROUND AND SUMMARY OF THE INVENTION

The multiplexing of multiple analog-to-digital converters to achieve a higher sampling rate is wellknown. Often, it is desired to have an analog to digital converter (ADC) sampling rate that is somewhat higher than is attainable with a single ADC using the current technology. By using more than one ADC and staggering their sample times, it is possible to increase the combined sample rate.

For example, the maximum sampling rate of a single ADC may be 500 megahertz and it is desired to sample an analog signal at one gigahertz. Two ADCs operating at their maximum rate of 500 megahertz may be multiplexed to achieve an effective sample rate of one gigahertz. The two ADCs are simply placed in parallel and alternate in sampling an analog signal. Each of the ADCs produces an output stream of digital data reflecting the value of the analog signal at the times sampled by that ADC. The two output streams are combined to form a single output stream equivalent to an output stream of a single ADC operating at one gigahertz. The effective sampling rate can be further increased by multiplexing additional ADCs. By multiplexing ADCs in this manner, the effective maximum sample rate is the number of multiplexed ADCs times the maximum sample rate of a single ADC.

One major problem presented by the multiplexed ADC approach is known as aperture skew. Aperture skew occurs when sample times of the additional ADCs do not occur at exactly the right time interval between the sample times of the first ADC. In the case of two multiplexed ADCs, the second ADC's sample times should occur exactly half-way between the first ADC's sample times. With four ADCs, the samples should be timed to occur at the quarter boundaries of the time interval between samples of the first ADC.

A common solution to the aperture skew problem is to provide a master sample and hold circuit which samples an input analog signal at the full effective sample rate. Consequently, as long as the master sample and hold samples at exact intervals, each of the multiplexed ADCs need only receive its signal sample sometime before the next sample is acquired by the master sample and hold.

In the present invention, a number of major performance improvements to multiplexed ADCs are made possible through the use of dithering. Use of dithering is known in the art. For example U.S. Pat. No. 4,550,309 discloses a residue digital-to-analog converter in which the digital resolution of the converter is enhanced by introducing a random dither signal into the process. In the present invention, however, dithering is used to detect and correct gain error in an analog-to-digital conversion process and differential gain errors in a multiplexed ADC circuit.

In most applications involving dithering, a dither signal is generated by a pseudo-random noise (PRN) generator, converted to analog in a digital-to-analog converter (DAC), and added to an analog signal before conversion in an ADC. The dither signal is then subtracted from the output of the ADC. The presence of the dither signal during the conversion is used to obtain a number of well-known advantages However, the dither signal may also be a source of additional error if the entire dither signal is not removed from the output.

Between generation of the dither signal and subtraction of the dither signal from the output, the dither signal may be subject to amplification by the DAC or the ADC. When the dither signal has been amplified and only the original amount of the dither signal subtracted from the output, some residue of the dither signal remains in the output This is one form of error caused by amplification or gain within an ADC circuit.

In an analog-to-digital conversion, the analog signal is also amplified by some factor during the conversion. This amplification or gain of the conversion process can vary due to a change in the operating conditions of the converter. Any variance of the gain (gain instability) introduces error since the conversion will not consistently generate the same value of digital output for the same value of the analog signal.

The present invention detects and corrects these gain errors by correlating the output with the original dither signal to detect any residual components of the dither signal remaining in the digital output signal. Any residue of the dither signal is indicative of gain error in the conversion. More specifically, the dither signal has been amplified by some amount during conversion by the DAC or the one or more ADCs. However, only the original amount of the dither signal is again subtracted to form the digital output signal. The amount of correlation detected therefore corresponds to a deviation from unity of the gain of the dither signal's path from the PRN generator through the DAC and ADC.

To correct this deviation, feedback control of the gain along the dither signal's path is provided. More specifically, the gain of a circuit element in the path is adjusted by an amount proportional to the correlation until unity gain along the path is achieved. The gain of either the ADC or the DAC may be adjusted in this step. Alternately, an analog amplifier or a digital multiplier can be added to the path to allow adjustment of the gain When a unity gain condition is achieved, there will be no remaining residue of the dither signal in the digital output signal.

The feedback gain control can also be used to effectively control the gain stability of the ADC conversion to equal that of the DAC to thereby reduce gain instability of the ADC. If the gain of the ADC is controlled in accordance with the amount of correlation, it will have the same gain stability as the DAC. The same effect is achieved when the gain of an analog amplifier or digital multiplier connected in series with the ADC is instead controlled.

Gain error correction by this method is also possible when the conversion of analog signal to digital is performed by multiplexed ADCs. The multiplexed ADCs will be connected in parallel as previously indicated. To control the gain of the multiplexed ADC conversion, an analog amplifier or digital multiplier is connected in series with the multiplexed ADCs. The gain of the analog amplifier or digital multiplier is controlled according to the correlation of the digital output with the dither signal as described above to provide overall gain stability to the multiplexed ADC conversion.

The present invention also includes detecting and correcting multiplexed ADC differential gain errors. As explained previously, with multiplexed ADCs, an analog signal is alternately sampled by each ADC. The digitized samples produced by the separate ADCs are combined into a single output stream. When the gain of the separate ADCs are different, this output stream will contain amplitude errors. In other words, the separate ADCs may produce different digital values for the same value of analog signal.

The present invention uses feedback gain control based on correlation with the dither signal to eliminate this differential gain error, i.e., the amplitude error caused by multiplexing ADCs having different gains. The feedback gain control adjusts the gain of each additional ADC in the set of multiplexed ADCs to equal the gain of a first ADC in the set. In this manner, the gain of each ADC of the set is the same.

A difference in gain between ADCs is detected by, first, digitally multiplying the output stream of one of the additional ADCs in the set of multiplexed ADCs by negative one. The resulting stream is then combined with the output stream of the first ADC. If there is a difference in gain between the two ADCs, there will be some residue of the dither signal in this combined stream. Thus, by correlating the combined stream with the original dither signal, the amount of the gain difference is measured. The gain of the additional ADC is adjusted to null out this gain difference. If the gain of an ADC is not directly adjustable, an analog amplifier or digital multiplier may be connected in series with the ADC. The overall gain of the series combination is adjustable by adjusting the gain of the amplifier or multiplier. The gain of the other ADCs in the multiplexed set are also adjusted in the same way to equal the gain of the first ADC. With the gain of all the ADCs equal to that of the first, differential gain errors are eliminated.

In an alternate embodiment of the invention, differential gain errors are corrected in a different manner. Instead of controlling the gain of each of the additional multiplexed ADCs to equal the gain of the first ADC, the gain of each dither signal path from the PRN generator, through the DAC and one of the ADCs is controlled to equal unity. Only the ADC portion of each of these paths is different. If each of the paths is controlled to have unity gain, the ADC portion of each path must have the same gain. Any difference in gain between ADCs is thus eliminated. Since each dither path also has unity gain, gain error has also been corrected and gain stability provided.

An additional advantage to the circuitry of the present invention is that it can be easily adapted to include predictive analog-to-digital conversion. Prediction is useful in analog-to-digital conversion to increase the dynamic range of the ADC. The introduction and use of dither in ADCs, such as in the present invention, actually reduces the dynamic range depending on the amount of dither introduced. The decrease may be significant if large scale dither is used.

In a predictive conversion scheme, digital signal processing circuitry is provided to predict the value of the next sample. This predicted value is subtracted from the analog signal before conversion and added back in after the conversion. Thus, the value converted by the ADC is merely the small difference between the actual value of the sample and the predicted value of the sample. Therefore, with prediction, the ADC need only be capable of resolving values in a much smaller range than the actual range of values to be converted. Depending on the accuracy of the prediction, the ADC need only resolve values in a very narrow range, enabling the circuitry to resolve values within the range to much finer quantization levels.

In the present invention, the same circuitry for introducing the dither signal before the ADC conversion and subtracting it out of the digital output stream may be used for prediction. In addition to converting the dither signal, the DAC may be used to bias the ADC to a narrow range of values near the anticipated value of the next sample. In other words, the negative of the predicted value of the next sample is added to the dither signal (digital noise word) and converted to analog by the DAC. The same value is subtracted with the dither signal from the output. This combined dither and predictive signal may be used to correlate against the ADC's output to correct amplitude and gain errors as was done with the dither signal alone.

The foregoing and additional features and advantages of the present invention will be more readily apparent from the following detailed description, which proceeds with reference to the accompanying drawings.

DETAILED DESCRIPTION OF THE DRAWINGS

Figure 1:
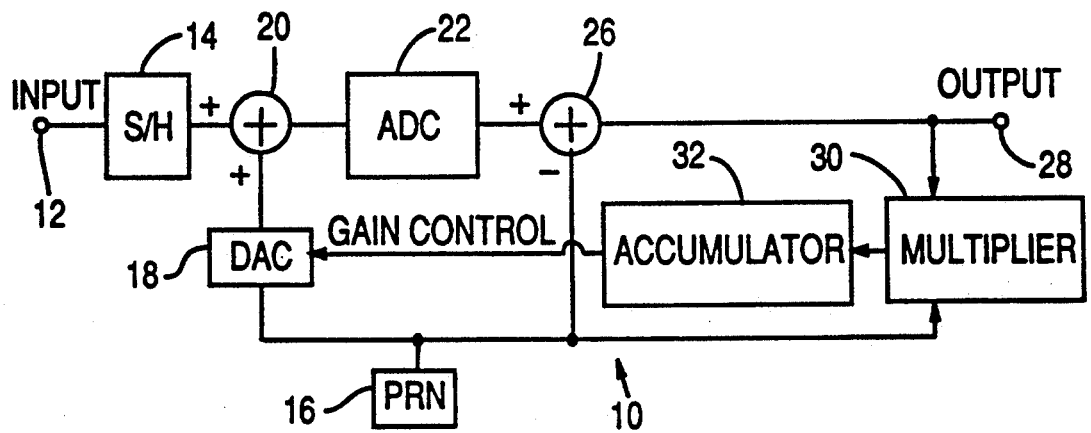
FIG. 1 is a block diagram of an analog-to-digital converter with dither according to one embodiment of the present invention.

Referring to FIG. 1, an analog-to-digital converter circuit 10 according to the present invention receives an analog signal at an input 12. A sample and hold block 14 acquires a sample of the analog signal and presents as its output the acquired sample. The output of sample and hold block 14 is held steady until the acquisition of a subsequent sample. A dither signal is generated by a pseudo-random noise generator (PRN) 16. The PRN 16 outputs a stream of digital random noise words. The digital random noise words are converted to an analog dither signal by a digital-to-analog converter (DAC) 18. An analog summation block 20 adds the dither signal in analog form to each sample of the analog signal.

Conversion of the combination of analog and dither signals is carried out by an analog-to-digital converter (ADC) 22. As a result of the conversion, a stream of digitized samples is generated at an output of the ADC. A digital adder 26 is connected to the output of the ADC 22. The adder operates to subtract the stream of digital random noise words generated in PRN 16 from the stream of digitized samples. In this manner, an amount equal to the original dither signal is subtracted from the digital stream. If the overall gain of a signal path from the PRN 16 through the DAC 18 and the ADC 22 is unity, then the entire dither signal is removed from the digital stream by this subtraction If the overall gain is not unity, a residue of the dither signal will remain in the digital stream The digital stream, after the subtraction, is provided as an output of the circuit at an output 28.

In order to detect any residue of the dither signal remaining in the digital stream and thereby detect a non-unity gain of the dither signal path, correlation circuitry comprising a multiplier 30 and an accumulator 32 is provided. The multiplier 30 correlates the digital stream against the stream of digital random noise words. Any residue of the dither signal remaining in the digital stream will correlate. Any correlation is accumulated in the accumulator 32.

In order to reduce gain error resulting from the presence of the dither signal residue in the output, it is desired that the overall gain of the dither signal through the DAC 18 and ADC 22 be exactly 1.0. The overall gain of the conversion is:

$$G_{overall} = G_{dac} * G_{adc} \tag{1}$$

To achieve an overall gain of 1.0, the gain of the DAC 18 can be adjusted to equal $$G_{dac} = 1.0/G_{adc} \tag{2}$$

Therefore, a non-unity gain of the dither signal may be compensated by adjusting the gain of the DAC 18.

By adjusting the gain of the DAC 18, the gain of the dither signal through the DAC 18 and the ADC 22 can be controlled to have unity gain. Appropriate adjustment of the DAC gain is provided by connecting the accumulator 32 output to a gain control input of the DAC. The DAC 18 gain is thereby adjusted by the amount of correlation accumulated by the accumulator 32. This feedback gain control of the DAC ensures that the dither signal is completely subtracted out of the digital output stream. Thus, errors resulting from residue of the dither signal remaining in the digital output stream will have been eliminated.

The hardware of the above circuit may be simplified in a number of ways without sacrificing effective operation. First, the correlation with the multiplier 30 and accumulator 32 need not be performed on every sample in the digital stream. The correlation may instead be performed on only a fraction of the samples, such as every third sample, while still providing effective feedback control of the dither signal gain. In this way, the multiplier 30 and accumulator 32 may be operated at a rate considerably less than that of the conversion circuitry.

A second simplification can be made to the correlation circuitry by correlating only the most significant bits of the dither signal (digital random noise words) against the digital output stream. If this is done, care must be taken that the other bits of the dither signal do not interfere with the correlation of the most significant bits with the digital output stream. However, effective correlation is still possible using just the most significant bits of the dither signal while greatly simplifying the multiplier 30 and accumulator 32.

Figure 2:
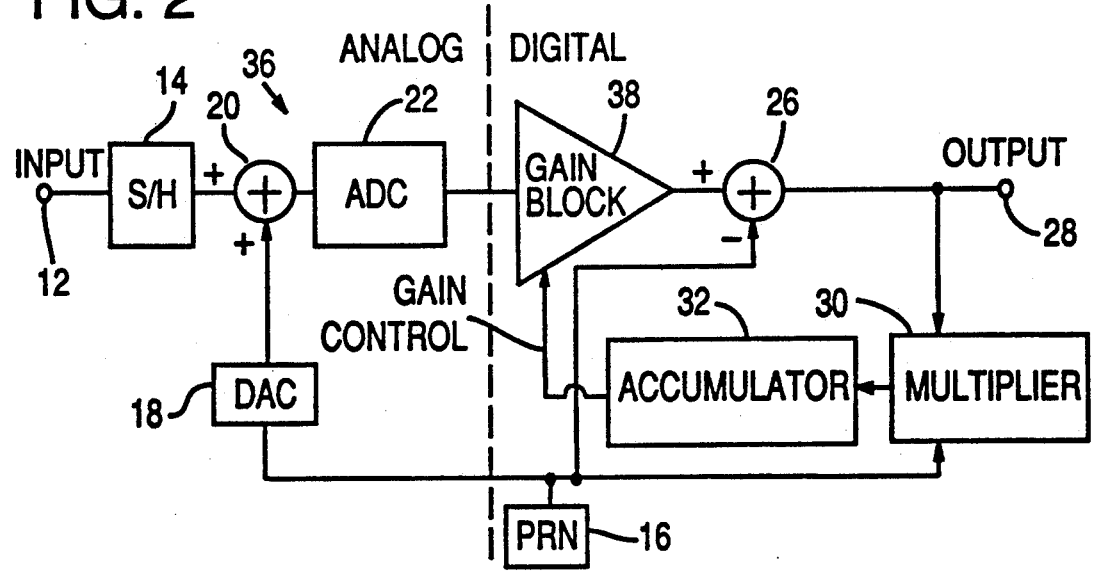
FIG. 2 is a block diagram of an analog-to-digital converter with dither according to a second embodiment of the present invention.

In the ADC circuit 10 of FIG. 1, only gain error resulting from the presence of dither signal residue in the output is corrected. Since the DAC 18 gain is adjusted instead of adjusting the gain of an element in the analog signal conversion path through the ADC 22, no additional gain stability is added to the analog signal conversion path. FIG. 2 illustrates an ADC circuit 36 which may also provide additional gain stability.

The ADC circuit 36 includes all the circuit elements of the ADC circuit 10 of FIG. 1. However, in the ADC circuit 36 of FIG. 2, the gain control signal produced by correlating the dither signal with the digital output stream in multiplier 30 and accumulator 32 drives a gain block 38. The gain block 38 in the illustrated second embodiment is a digital multiplier. Alternately, it would be possible to place the gain block prior to the ADC 22 in the signal path. In which case, an analog amplifier would be used as the gain block. However, use of an analog amplifier in this application would also require the addition of another DAC to convert the digital feedback gain control signal.

Similar to feedback gain control of the DAC 18 in the ADC circuit 10, feedback gain control of the gain block 38 adjusts the overall gain of the dither signal path to unity. The overall gain of the dither signal path including the gain block 38 is:

$$G_{overall} = G_{dac} * G_{adc} * G_{block} \tag{3}$$

An overall dither signal path gain of 1.0 is obtained by adjusting the gain of block 38 as follows:

$$G_{block} = 1.0/(G_{adc} * G_{dac}) \tag{4}$$

When the gain of the DAC is relatively stable, the gain of the analog signal along the analog signal conversion path between input 12 and output 28 is stabilized by the feedback gain control of block 38. The gain of the analog signal conversion path is:

$$G_{path} = G_{adc} * G_{block} \tag{5}$$

The gain of block 38 is given by equation (4) when controlled to yield unity dither signal path gain, so by substitution $$G_{path} = 1.0/G_{dac} \tag{6}$$

Thus, the gain of the analog signal conversion path is tied to the DAC gain and will remain relatively constant when the DAC gain is stable and the block 38 gain is controlled to provide unity dither signal path gain.

In those cases where it is possible to directly adjust the ADC gain, the advantages of feedback stability and unity dither signal path gain may also be obtained by adjustment of the ADC 22 gain in place of adjusting the block 38 gain. Thus, the ADC circuit 36 could also be implemented without a gain block 38 if the feedback gain control signal drives a gain control input of the ADC 22.

Figure 3:
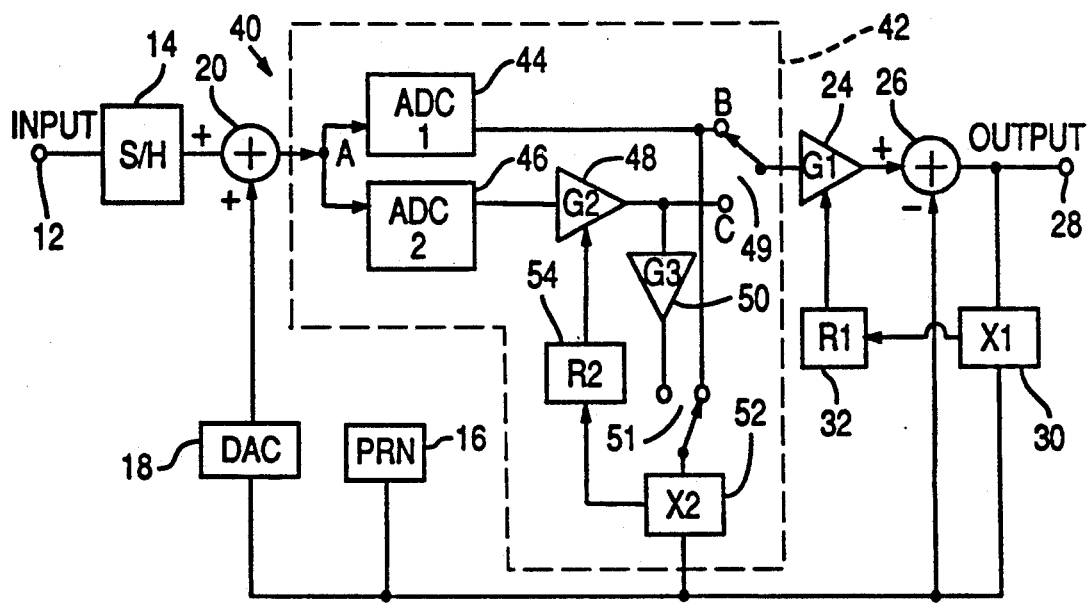
FIG. 3 is a block diagram of a circuit for analog-to-digital conversion of a signal with multiplexed ADCs according to a third embodiment of the present invention.

FIG. 3 illustrates a third embodiment of the present invention in which dither is also used to correct amplitude errors of multiplexed ADCs A dithered, multiplexed two-ADC circuit 40 includes the circuitry illustrated in FIG. 2 for elimination of gain errors. Only, instead of a single ADC 22, circuitry 42 including dual multiplexed ADCs and circuit blocks for eliminating multiplexed ADC differential gain error are provided. Thus, this circuit provides correction of ADC conversion gain error and multiplexed ADC differential gain error. Without gain block 24, multiplier 30 and accumulator 32, the circuit would not correct gain error. However, the circuit will still effect correction of multiplexed ADC differential gain error.

As explained previously with reference to FIG. 1, an analog signal is received at an input 12, sampled at a full sample rate by a sample and hold block 14, and summed at a summation block 20 with a dither signal generated at a PRN 16 and converted to analog by a DAC 18. Two ADCs 44 and 46 sample and digitize the combination of analog and digital signal. The sampling and digitizing operation alternates between the two ADCs. In this manner, with each ADC operating at its full rate, the signal is sampled at twice the rate of one ADC. Provision of the sample and hold block 14 obviates the requirement of having each ADC sample exactly between the other's sample times. Each ADC need only sample the signal while it is still held valid by the sample and hold block. Of course, the sample and hold block must sample the signal at exact intervals and at the full sample rate. However, the timing of the single sample and hold block is more easily designed to be within certain tolerances than the timing of the two ADCs.

The use of dual multiplexed ADCs 44 and 46 significantly increases the sample rate of the converter circuit 40. However, significant conversion errors may also be introduced. Particularly, a difference in gain between the ADCs introduces conversion error referred to here as multiplexed ADC differential gain error. In the case of two multiplexed ADCs, the gain difference between them may be represented mathematically by the variable, E. The gain of the ADC 44 may be represented as:

$$G_{adc1} = 1 + E/2 \qquad (7)$$

and the gain of ADC 46 as:

$$G_{adc2} = 1 - E/2 \qquad (8)$$

The total gain difference is, again,
$$G_{adc1} - G_{adc2} = (1 + E/2) - (1 - E/2) = E \qquad (9)$$

The result of the multiplexed conversion by ADCs 44 and 46 is a stream of digitized samples. The output streams of the two ADCs 44 and 46, at points B and C respectively, are combined to form a single digital output stream by a switch 49 or equivalent means. Each digitized sample is a representation of the analog signal multiplied by the gain of the converter which produced the sample. Adjacent digitized samples in the output stream are converted by alternate ADCs. Thus, the stream is conceptually an infinite sequence of the analog signal multiplied alternately by $G_{adc1}$ and $G_{adc2}$. This may be represented mathematically as:

$$output = input * (1 + (E/2) * \cos(\pi * i)) \qquad (10)$$

where i is an integer index of the sample number. The cosine of the product, $\pi$ times the index, is a mathematical representation of an infinite series which alternates between 1 and −1. Specifically, $$\cos(\pi * i) = 1, -1, 1, -1, \ldots \qquad (11)$$

After combining by switch 49, an amount equivalent to the dither signal is subtracted from the digital output stream at an adder 26 so that only the analog input signal is represented in the digital output stream at a circuit output 28. Still, as a result of the gain difference, the output digital signal is not a true digital representation of the input signal. The effect on the output digital signal is to introduce alias products about a frequency of ¼ the sample rate in addition to the unavoidable alias products about ½ the sample rate. The amplitude of the additional alias products is in proportion to the difference, E, in gain between the ADCs 44 and 46.

The present invention includes circuitry for eliminating multiplexed ADC differential gain error (the additional alias products) with the use of dither. Accordingly, as previously indicated, a dither signal is introduced into the analog signal before conversion by the two multiplexed ADCs 44 and 46. After conversion, the output stream of ADC 46 is multiplied in a second gain block 48 by an adjustable gain factor. The intent of providing the gain block is to adjust the gain of a signal path from A to C (path a,c) in FIG. 2 to equal the gain of a signal path from A to B (path a,b) More specifically, the gain of path a,b is equal to the gain of ADC 44, or:

$$G_{a,b} = G_{adc1} \qquad (12)$$

The gain of path $_{a,c}$ equals the gain of ADC 46 times the gain of the second gain block 48.

$$G_{a,c} = G_{adc2} * G_{block2} \qquad (13)$$

The gain of path $_{a,b}$ can be adjusted to equal the gain of path $_{a,c}$ by adjusting the gain of the gain block 48 to equal:

$$G_{block2} = G_{adc1}/G_{adc2} \qquad (14)$$

Therefore, adjustment of the gain of the second gain block 48 can eliminate the gain difference and amplitude error.

The gain of the second gain block 48 is appropriately adjusted to eliminate the gain difference by a feedback gain control loop comprising a third gain block 50, a second switch 51, a second multiplier 52, and a second accumulator 54. After adjustably scaling the output of the ADC 46 by the second gain block 48, the ADC output is again multiplied in the third gain block 50 by a fixed gain of −1. The ADC 46 output is then combined by the second switch 51 with the ADC 44 output to form a second single digital stream. The effect of the second multiplication is to multiply the second stream by $\cos(-\pi * i)$. The second stream as a function of the ADCs' input is then:

$$stream = input*(1 + (E/2)*\cos(\pi*i))*\cos(-\pi*i) \qquad (15)$$

Which simplifies as follows:

$$stream = input*(\cos(-\pi*i) + E/2)$$

$$stream = input*\cos(-\pi*i) + input*(E/2) \qquad (16)$$

This second stream is correlated in multiplier 52 against the stream of digital noise words (the dither)

from PRN 16. As previously described, the input to the ADCs receives a combination of both the analog signal and the dither signal. Therefore, both terms of equation (16) for the second stream, which include this combined input, could correlate against the dither signal. Since $\cos(-\pi^* i)$ is an infinite series alternating between $-1$ and 1, its average value over time is zero. Therefore, the (input * $\cos(-\pi^* i)$) term of the stream will not correlate. The second term which includes (E/2), however, will correlate as long as E, the gain difference, is not equal to zero.

Correlation between the second term and the dither is accumulated in the accumulator 54. Since the correlation corresponds to the gain difference, the accumulator is able to feedback a control signal to correctly adjust the gain in gain block 54. As previously indicated, this eliminates the multiplexed ADC differential gain error.

The circuit illustrated in FIG. 3 can be extended to accommodate more than two multiplexed ADCs. Each additional ADC is provided with a separate gain block and feedback gain control loop just as the second ADC 46 in FIG. 3 is provided with the gain block 48 and feedback gain control loop comprising the multipliers 50 and 52, and the accumulator 54. Each ADC's gain block and feedback gain control loop will cause the gain of the conversion path through the ADC and gain block to equal the gain through the first ADC 44. In this manner, the conversion path through each ADC will have the same gain to thereby eliminate differential gain error.

Figure 4:
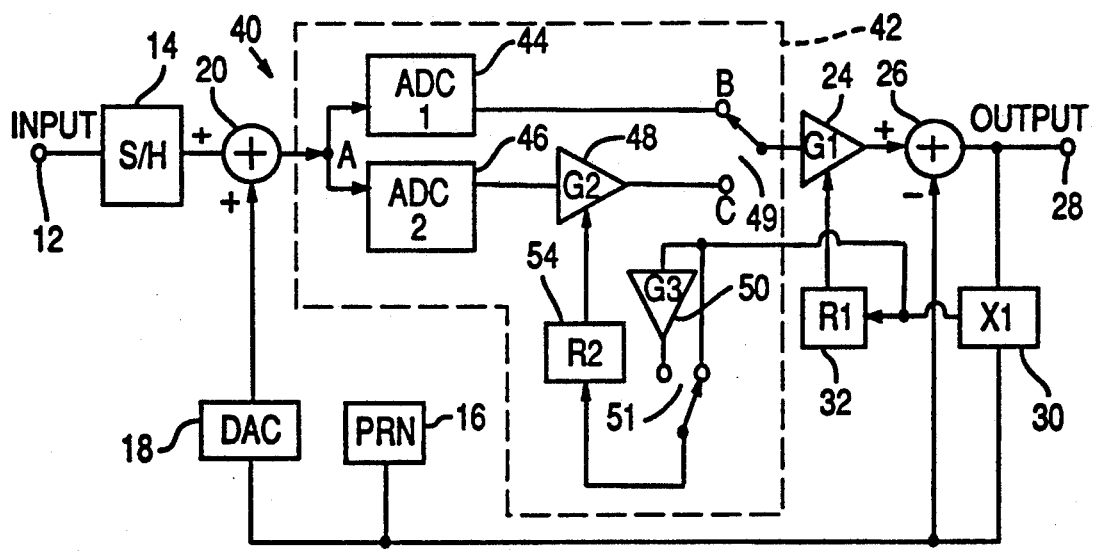
FIG. 4 is a block diagram showing a simplified implementation of the circuit of FIG. 3.

The embodiment shown in FIG. 3 may be simplified as shown in FIG. 4, eliminating the second multiplier 52. In this simplified circuit, the multiplication of the second ADC's samples by $-1$ in the third gain block 50 is performed after the correlating multiplication. The correlating multiplication is performed by the multiplier 30. This simplification is possible because the arithmetic process of multiplication is commutative, i.e., the order of multiplication does not affect the result. In this simplified circuit, the second switch 51 connects directly to the input of the second accumulator 54. A first input to the second switch 51 is connected to the third gain block 50 which is in turn connected to the output of the multiplier 30. A second input of the second switch 51 is also connected directly to the output of the multiplier 30. Other than the change in the order of multiplication, this simplified circuit functions the same as the circuit shown in FIG. 3.

Figure 5:
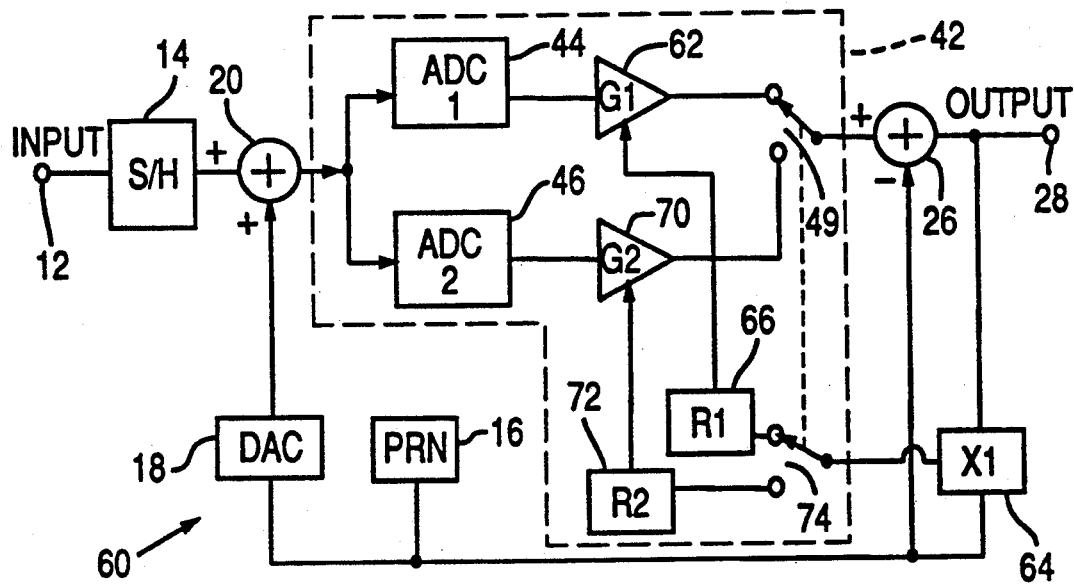
FIG. 5 is a block diagram of a multiplexed ADC circuit in accordance with a fourth embodiment of the present invention.

A fourth embodiment of the invention which incorporates both gain error correction and multiplexed ADC differential gain error correction is illustrated in FIG. 5. The circuit 60 in FIG. 5 is a natural extension of the circuit 36 shown in FIG. 2 to multiplexed ADCs. It is also a simpler implementation of multiplexed differential gain error correction than the circuit 40 shown in FIG. 3.

The principle behind the circuit 60 is that the dither signal path through the DAC and each ADC separately is controlled through feedback gain control to be unity. Thus, the gain of a dither signal path through the DAC 18, the ADC 44, and a gain block 62 is controlled by a feedback loop comprising a multiplier 64 and an accumulator 66. The gain of a second dither signal path through the DAC 18, the ADC 46, and a gain block 70 is controlled by feedback through the multiplier 64 and an accumulator 72.

The gain of gain blocks 62 and 70 adjust to provide a unity gain for these dither signal paths in the same manner as the gain block 38 provides unity dither signal gain in the circuit 36 of FIG. 2. Specifically, the multiplier 64 correlates the original dither signal against the output to detect deviations from unity gain. The amount of correlation accumulates for each path in its respective accumulator 66 or 72. Switches 49 and 74 operate in tandem. As switch 49 acquires the next sample for the output stream from an ADC, switch 74 accumulates the correlation of that sample against the dither signal in the appropriate accumulator 66 or 72 for the particular ADC's path. The amount of correlation is used to generate a gain control signal for adjusting the gain of the gain blocks 62, 70 for unity dither signal path gain. Unity dither signal path gain provides the advantage of eliminating gain error as described above in connection with FIGS. 1 and 2.

The same feedback gain control that provides unity dither signal path gain also insures that the gain of the input signal through each ADC is the same. To illustrate, the gain of the dither signal path through the DAC 18, the ADC 44 and the gain block 62 is as follows:

$$G_{dsp1} = G_{dac}*G_{adc44}*G_{block62} = 1 \quad (17)$$

The gain of the dither signal path through the ADC 46 is:

$$G_{dsp2} = G_{dac}*G_{adc46}*G_{block70} = 1 \quad (18)$$

From equation (17), we find that the gain through the ADC 44 and the gain block 62 is:

$$G_{adc44}*G_{block62} = 1/G_{dac} \quad (19)$$

Also, from equation (18), we find that the gain through the ADC 46 and the gain block 70 is:

$$G_{adc46}*G_{block70} = 1/G_{dac} \quad (20)$$

Equations (19) and (20) demonstrate that by providing unity dither signal path gain through feedback control of gain blocks 62 and 70, the gain of the path through the ADC 44 and the gain block 62, and the gain of the path through the ADC 46 and the gain block 70 have been equalized. With the gain of these two paths equalized, the conversion of the input signal by each path is consistent. Thus, feedback gain control of the gain blocks 62 and 70 provides both gain error correction and differential gain error correction.

The circuit 60 may be modified consistent with this invention to provide multiplexing of more than two ADCs. Additional ADCs may be multiplexed in the same manner as ADCs 44, 46 by providing a gain block and feedback loop for each ADC. The circuit 60 may also include the alternate implementations and simplifications described above in connection with FIGS. 1 and 2.

Figure 6:
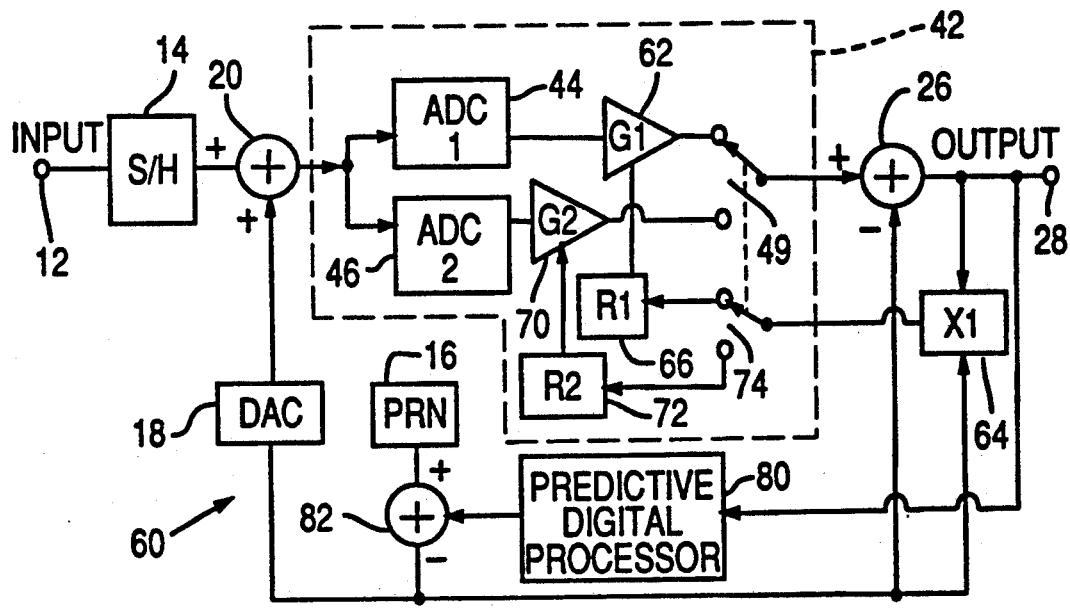
FIG. 6 is a block diagram of a multiplexed ADC circuit in accordance with the present invention including predictive conversion.

FIG. 6 shows the circuit 60 modified to include predictive conversion. The circuit operates as described above in connection with FIG. 5. However, a digital processor 80 has been added. The digital processor 80 processes the digital samples of the output signal to predict the value of the next sample. The predicted next value is subtracted in a summation block 82 from the dither signal generated in the PRN generator 16 The sum from the summation block 82 is converted to analog in the DAC 18 and added to the next sample of the input signal. The sum is also subtracted from the output in summation block 26. In this manner, the predicted next value from the digital processor 80 is subtracted from the input and added again at the output.

In effect, the addition of the predicted next value has biased the ADCs to a narrow range of values. Only the difference between the input signal and the predicted value (along with the dither signal) is converted by the ADCs. Each of the ADCs has the capability of resolving only a set number of quantization levels. By narrowing the range of values the ADCs must convert, the size of the quantization levels may also be narrowed. Consequently, with prediction, the resolution of the ADCs can be increased.

FIG. 6 shows how predictive conversion can be added to the circuit 60 using the same DAC 18 and summation block 26 as is used for introduction of dither. Predictive conversion can be added in a like manner to the circuits 10, 36, and 40 of FIGS. 1, 2, and 3.

Having described and illustrated the principles of my invention with reference to an illustrative embodiment, it will be recognized that the invention can be modified in arrangement and detail without departing from such principles. Accordingly, I claim as my invention all such embodiments as may come within the scope and spirit of the following claims and equivalents thereto.

I claim:

1. A method of dynamically correcting gain errors occurring during analog-to-digital conversion of an input analog signal comprising the steps:
    generating a dither signal with a digital pseudo-random noise generator;
    converting the dither signal to analog form with a digital-to-analog converter;
    summing the dither signal and the input analog signal to yield a summed signal;
    converting the summed signal into a digital output stream corresponding thereto;
    subtracting the dither signal from the digital output stream;
    correlating the dither signal to the digital output stream to detect residue of the dither signal remaining in the digital output stream indicative of non-unity gain of the dither signal; and
    adjusting the gain of the dither signal to remove the residue.

2. The method of claim 1 for also dynamically correcting a gain difference between first and second analog-to-digital converters in a set of at least two multiplexed analog-to-digital converters, wherein the step of converting into a digital output stream comprises:
    converting with the first analog-to-digital converter the summed signal into a first stream of digital samples corresponding thereto;
    converting with the second analog-to-digital converter the summed signal into a second stream of digital samples corresponding thereto;
    multiplying one of said first and second streams by negative one;
    combining said first and second streams;
    multiplying said first and second streams with the dither signal to determine an amount of correlation between said first and second streams and the dither signal;
    accumulating the amount of correlation; and
    adjusting the gain of converting the dither signal and input analog signal into said second stream according to the amount of correlation to eliminate a difference in gain between the first and second analog-to-digital converters.

3. The method of claim 2 wherein the step of multiplying said first and second streams with the dither signal is performed before the step of multiplying by negative one.

4. The method of claim 1 for also dynamically correcting differential gain errors of N multiplexed analog-to-digital converters where N is an integer number greater than one, wherein the step of adjusting and the step of converting into a digital output stream together comprise:
    converting with N analog-to-digital converters the summed signal into N digital streams respectively;
    combining the N digital streams into said digital output stream;
    accumulating separately for each one of the N analog-to-digital converters an amount of the residue contributed thereby; and
    adjusting the gain of each one of the N analog-to-digital converters according tot he amount of the residue contributed respectively thereby.

5. The method of claim 4 wherein the step of adjusting the gain of each one of the N analog-to-digital converters comprises:
    multiplying each of the N digital streams with an adjustable gain factor; and
    adjusting said gain factor according to the amount of the residue contributed by the respective one of the N analog-to-digital converters.

6. The method of claim 1 for also increasing the resolution of the analog-to-digital conversion, the method of comprising:
    predicting a value of a next sample of the digital output stream;
    subtracting said value from the dither signal and the input analog signal before the step of converting into the digital output stream; and
    adding said value to the digital output stream.

7. An electronic circuit for converting an analog input signal into a digital output stream without analog-to-digital converter gain errors, comprising:
    an input for receiving the analog input signal;
    a noise source for generating a stream of digital noise words;
    a digital-to-analog converter (DAC) coupled to the noise source for converting the stream of digital noise words into a dither signal;
    an analog summation circuit connected to the DAC and the input for adding the dither signal and the analog input signal to produce a summed signal;
    at least one analog-to-digital converter for converting the summed signal into a digital output stream;
    a subtraction circuit for subtracting the stream of digital noise words from the digital output stream;
    a correlator connected to the subtraction circuit for detecting residue of the dither signal in the digital outputs stream and for controlling the gain of the dither signal responsive to the amount of the residue detected in the digital output stream.

8. The electronic circuit of claim 7 comprising a digital multiplier for multiplying each of the digitized samples of the digital output stream by an adjustable gain factor, the gain factor being responsive to a feedback signal generated by the correlator to control the gain of the dither signal.

9. The electronic circuit of claim 7 comprising an analog amplifier circuit for scaling the amplitude of the dither signal by an adjustable gain factor responsive to a feedback signal generated by the correlator to control the gain of the dither signal.

10. The electronic circuit of claim 7 wherein the at least one analog-to-digital converter is a single analog-to-digital converter having an adjustable gain, said gain being responsive to a feedback signal generated by the correlator to control the gain of the dither signal.

11. The electronic circuit of claim 7 wherein the digital-to-analog converter has an adjustable gain, said gain being responsive to a feedback signal generated by the correlator to control the gain of the dither signal.

12. The electronic circuit of claim 7 for also eliminating multiplexed ADC differential gain error wherein the at least one analog-to-digital converters comprise N multiplexed analog-to-digital converters for generating N streams of digitized samples corresponding to the summed signal and combining means for combining the N streams of digitized samples into the digital output stream, N being an integer greater than one, the electronic circuit further comprising:
  N−1 correlators for detecting differences in gain between a first of said N streams of digitized samples and each of a second through Nth of said N streams respectively and for generating N−1 feedback signals proportional to said differences to control the gain of said N streams.

13. The electronic circuit of claim 12 comprising N−1 digital multipliers connected respectively to the output of each of the second through Nth analog-to-digital converters for multiplying each of the digitized samples of said second through Nth streams of digitized samples by N−1 adjustable gain factors, the N−1 gain factors being responsive to the N−1 feedback signals respectively.

14. The electronic circuit of claim 12 comprising N−1 analog amplifier circuits connected between the analog summation circuit and each of a second through Nth of the N multiplexed analog-to-digital converters for scaling the amplitude of the summed signal at the inputs to the second through Nth analog-to-digital converters by N−1 adjustable gain factors responsive to the N−1 adjustable feedback signals.

15. The electronic circuit of claim 12 wherein a second through Nth of the N multiplexed analog-to-digital converters have adjustable gains, said gains being responsive to the N−1 feedback signals.

16. The electronic circuit of claim 7 for also eliminating multiplexed ADC differential gain errors, wherein the at least one analog-to-digital converters comprise:
  N multiplexed analog-to-digital converters for generating N streams of digitized samples corresponding to the summed signal; and
  combining means for combining the N streams of digitized samples into the digital output stream, N being an integer greater than one, and wherein the correlator comprises:
  at least one multiplier connected to the subtraction means for multiplying the digital output stream and the digital noise words to detect residue of the dither signal remaining in the digital output stream; and
  N accumulators coupled to the at least one multiplier, each accumulator operative to accumulate residue of the dither signal contributed by a respective one of the N multiplexed analog-to-digital converters and to generate a feedback signal to control the gain of a respective one of the N streams of digitized samples.

17. The electronic circuit of claim 16 comprising N digital multipliers, each of the N digital multipliers connected to the output of one of the N multiplexed analog-to-digital converters and to one of the N multiplexed analog-to-digital converters and to one of the N accumulators for multiplying the stream of digitized samples produced by said one of the multiplexed analog-to-digital converters by an adjustable gain factor responsive to the feedback signal generated by said one of the N accumulators.

18. The electronic circuit of claim 16 comprising N−1 analog amplifier circuits, each of the N analog amplifier circuits connected to the input of one of the N multiplexed analog-to-digital converters and to one of the N accumulators for scaling the amplitude of the summed signal at said input by an adjustable gain factor responsive to the feedback signal generated by said one of the N accumulators.

19. The electronic circuit of claim 16 wherein each of the N multiplexed analog-to-digital converters is connected to one of the N accumulators and has an adjustable gain, said gain being responsive to the feedback signal generated by said one of the N accumulators.

20. The electronic circuit of claim 7 for also increasing the resolution of the analog-to-digital conversion, comprising:
  means for predicting a next sample value of the digital output stream; and
  a second subtraction circuit connected to said means and to the output of the noise source for subtracting the next sample value from the stream of digital noise words.

21. In a method of converting an input analog signal to an output digital signal, the method including adding and subsequently removing a dither signal to improve conversion accuracy, an improvement comprising:
  generating a control signal related to a correlation between the output digital signal and the dither signal; and
  controlling the gain of a circuit sage through which the dither signal passes in response to the control signal;
  wherein dither residue in the digital output signal due to gain error is minimized.

22. The method of claim 21 in which the dither signal is a digital signal.

23. The method of claim 21 in which the generating step includes correlating the output digital signal with the dither signal to produce a correlation signal.

24. The method of claim 23 in which the generating step further includes multiplying the output signal with the dither signal to produce the correlation signal.

25. The method of claim 24 in which the generating step further includes accumulating the correlation signal to produce the control signal.

* * * * *